United States Patent
Chou

(10) Patent No.: US 11,329,610 B2
(45) Date of Patent: May 10, 2022

(54) STRUCTURE AND METHOD OF AUDIO AMPLIFIER WITH POWER FEEDBACK

(71) Applicant: Chung-Fu Chou, Yongkang (TW)

(72) Inventor: Chung-Fu Chou, Yongkang (TW)

(*) Notice: Subject to any disclaimer, the term of this patent is extended or adjusted under 35 U.S.C. 154(b) by 20 days.

(21) Appl. No.: 16/676,518

(22) Filed: Nov. 7, 2019

(65) Prior Publication Data

US 2021/0143777 A1    May 13, 2021

(51) Int. Cl.
*H03F 1/02* (2006.01)
*H03F 1/34* (2006.01)
*H04R 3/04* (2006.01)
*H03F 3/217* (2006.01)

(52) U.S. Cl.
CPC .......... *H03F 1/0238* (2013.01); *H03F 1/347* (2013.01); *H04R 3/04* (2013.01); *H03F 2200/03* (2013.01)

(58) Field of Classification Search
CPC .... H03F 1/0238; H03F 1/347; H03F 2200/03; H04R 3/04
USPC .............................. 330/127, 129, 298, 207 P
See application file for complete search history.

(56) References Cited

U.S. PATENT DOCUMENTS

| | | | | |
|---|---|---|---|---|
| 6,940,981 B2* | 9/2005 | Neunaber | ................. | H03F 1/52 |
| | | | | 381/55 |
| 9,647,614 B2* | 5/2017 | Otani | ...................... | H03F 1/342 |
| 9,794,687 B2* | 10/2017 | Napoli | ................... | H03G 7/002 |
| 10,701,484 B2* | 6/2020 | Thormundsson | ....... | G10L 19/00 |
| 10,826,441 B2* | 11/2020 | Faulstich | ................. | H04R 3/02 |

* cited by examiner

*Primary Examiner* — Hieu P Nguyen
(74) *Attorney, Agent, or Firm* — Karin L. Williams; Alan D. Kamrath; Mayer & Williams PC

(57) ABSTRACT

The present invention generally relates to a structure and method of audio amplifier with power feedback, including a power amplifying unit, a loud-speaker, a current sensing unit, a voltage sensing unit and a multiplying unit. The power amplifying unit includes an input side and an output side, the input side inputs an audio voltage signal, and the loudspeaker is electrically connected to an output side of the power amplifying unit. The current sensing unit is electrically connected to the output side of the power amplifying unit and senses the output current of the power amplifying unit and then converts it into a current control voltage signal. The voltage sensing unit is electrically connected to the output side of the power amplifying unit, and senses the output voltage of the power amplifying unit to form an output sensing voltage signal. The multiplying unit obtains the voltage of the current control voltage multiplied by the output sensing voltage, and the output side of the multiplying unit is electrically connected to the input side of the power amplifying unit to form a closed loop power feedback structure. Accordingly, the output quality of the amplifier and loud-speaker is improved.

10 Claims, 10 Drawing Sheets

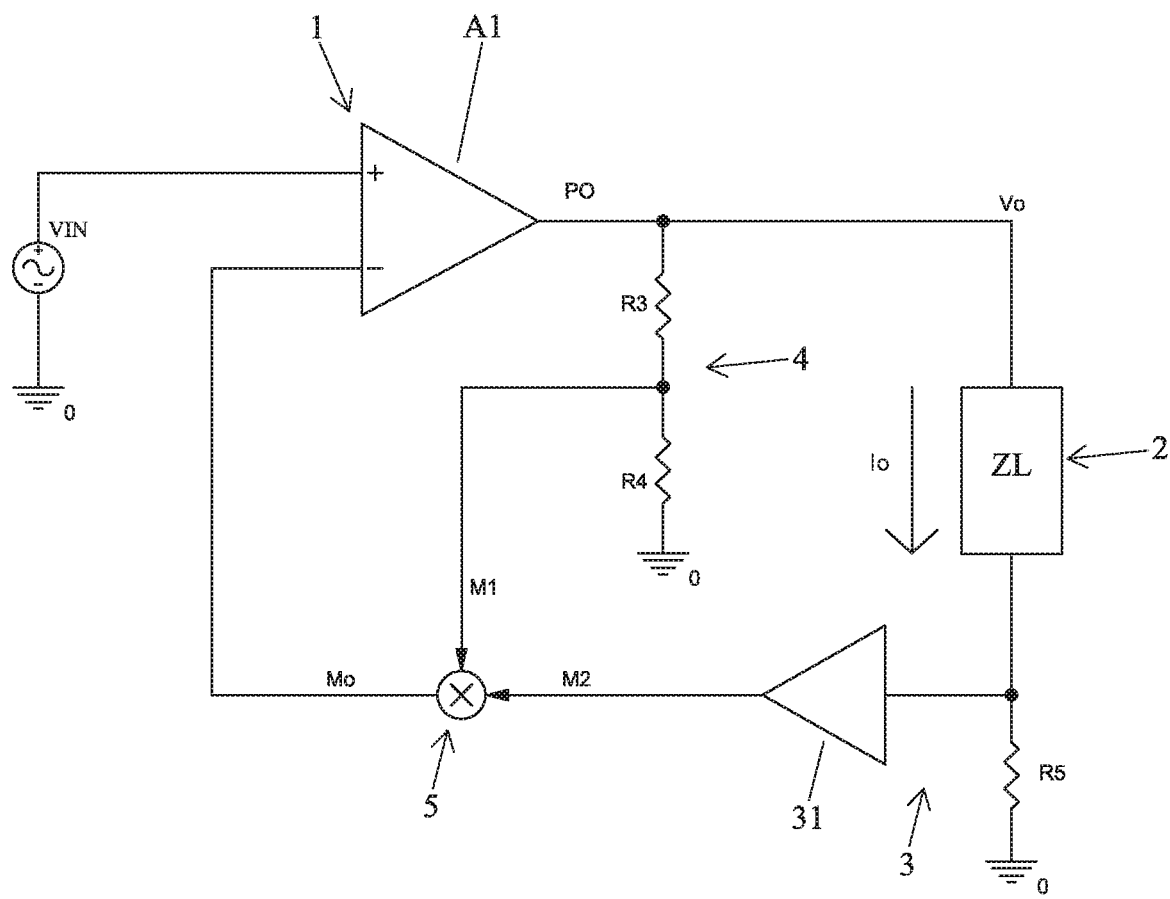
F I G . 2

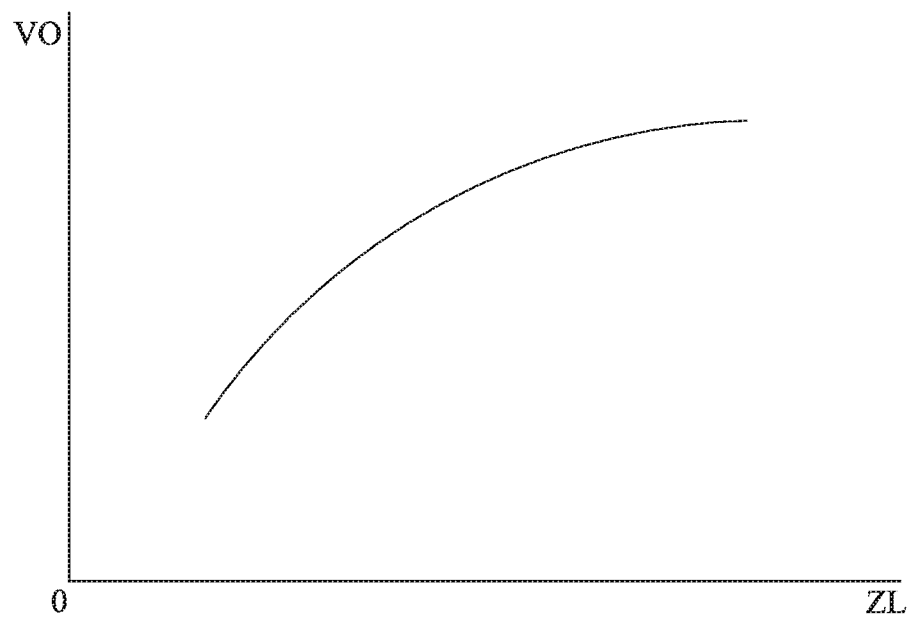
F I G . 4

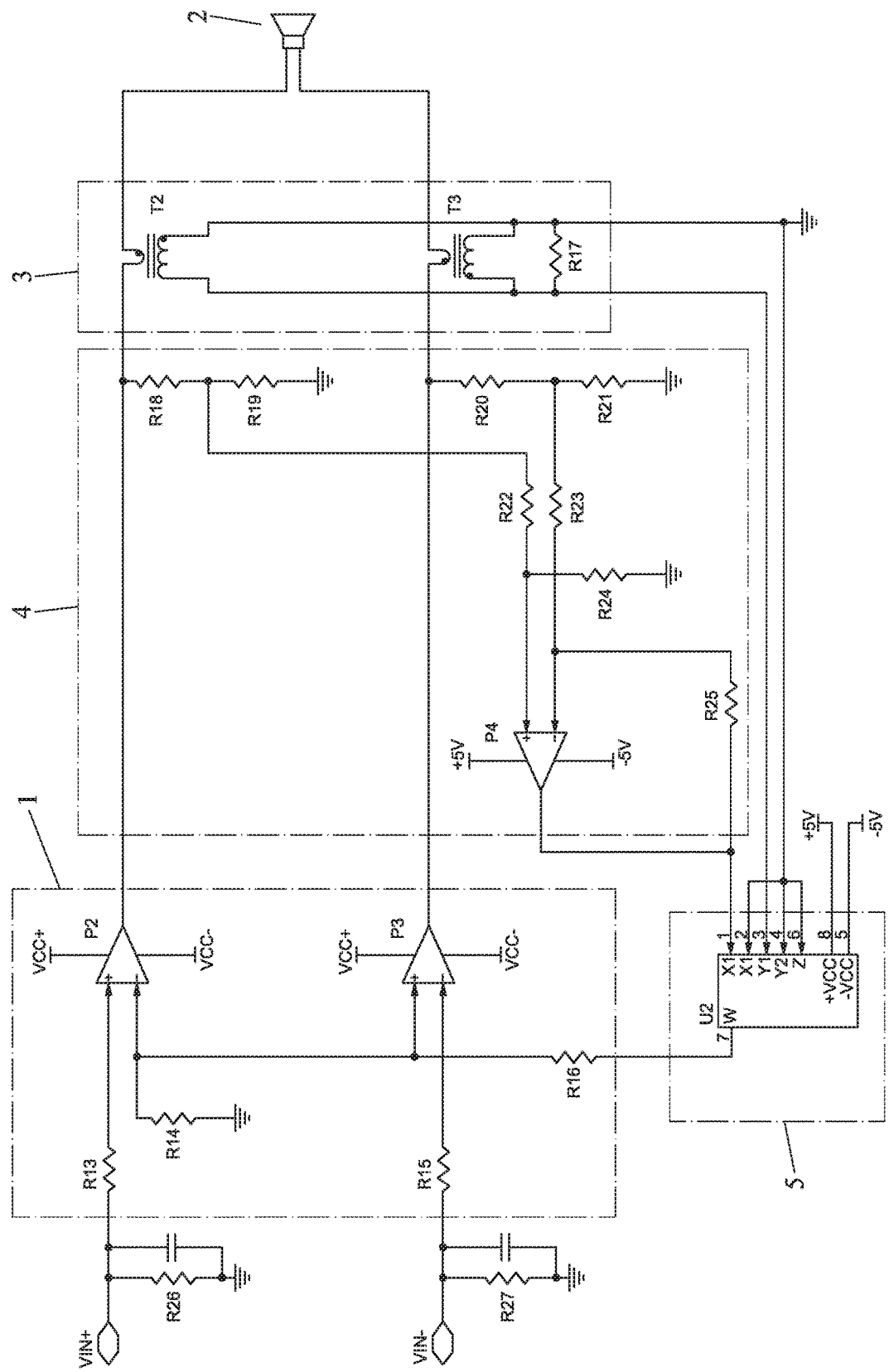
F I G . 6

STRUCTURE AND METHOD OF AUDIO AMPLIFIER WITH POWER FEEDBACK

BACKGROUND OF INVENTION

The present invention generally relates to a structure and method of audio amplifier with power feedback, and more particularly to a structure and method for the power feedback control amplifier to output the power and improve the output quality of a loudspeaker.

DESCRIPTION OF RELATED ART

As shown in FIG. 7, a conventional audio amplifier circuit structure includes a power amplifier 1', a loudspeaker 2' disposed on the output side of the power amplifier 1', the input side of the power amplifier 1' is connected to a negative feedback resistor R2 and a resistor R1 is grounded, the audio voltage Vin is inputted from the positive terminal of the power amplifier 1', and the output voltage of the power amplifier 1' is VO=Vin*(R2/R1+1), so the output power of the power amplifier 1' is PO=(VO)$^2$/ZL.

However, the DC impedance ZL of the loudspeaker 2' is not a fixed value, generally in the range of 4~16Ω, and its AC impedance shows a nonlinear variation in the audio range of 20~20 KHZ as shown in FIG. 8. In fact, the power amplifier 1' will cause the difference in the DC impedance ZL of the loudspeaker 2', will not cause the difference of the output voltage VO under the condition of the same input audio voltage Vin, as shown in FIG. 9. However, as shown in FIG. 10, the impedance ZL variation will directly cause the difference of the output power PO of the power amplifier 1' under the same input audio voltage Vin signal level. This phenomenon will cause the amplifier with insufficient maximum power bearing capacity to damage the amplifier, and the natural uneven frequency/impedance characteristics of the loudspeaker 2' will cause the playback music distortion and poor output quality.

Therefore, although the output sound quality can be improved by the high-quality loudspeaker, it is still difficult to avoid the default of output distortion caused by the frequency/impedance characteristics of the loudspeaker itself.

SUMMARY OF THE INVENTION

The purpose of the present invention is to provide a structure and method for outputting the power and improving the output quality of a loudspeaker by a power feedback control amplifier.

The structure of the present invention includes a power amplifying unit, a loudspeaker, a current sensing unit, a voltage sensing unit and a multiplying unit; the power amplifying unit can be a class A, class AB, class D and class G amplifier, and it can be the single-ended amplification or bridging (BTL) structure with an input side and an output side, and the input side inputs an audio voltage signal; and the loudspeaker is electrically connected to an output side of the power amplifying unit; the current sensing unit is electrically connected to the output side of the power amplifying unit and senses the output current of the power amplifying unit and then it is converted into a current control voltage signal; and the voltage sensing unit is electrically connected to the output side of the power amplifying unit and senses the output voltage of the amplifying unit to form an output sensing voltage signal; the input side of the multiplying unit is electrically connected to the current control voltage signal and the output sensing voltage signal, and obtains the voltage of the current control voltage multiplied by the output sensing voltage, and the output side of the multiplying unit is electrically connected to the input side of the power amplifying unit to form a closed loop power feedback structure.

The method of the present invention with a power feedback audio amplifier includes:

disposing a power amplifying unit, the power amplifying unit is outputted to a loudspeaker;

selecting the current signal outputted from the power amplifying unit to the loudspeaker;

selecting the voltage signal outputted from the power amplifying unit;

an output power level signal is obtained from the current signal multiplied by the voltage signal and then fed back to the input side of the power amplifier to form a feedback closed loop structure, and output the power amplifying unit to maintain a constant output power.

Further, the output current signal of the present invention is converted into a current control voltage signal; and the output voltage of the power amplifying unit is converted into an output sensing voltage signal by the voltage division; and also including a multiplying unit, the current control voltage signal and the output sensing voltage are inputted to the multiplying unit for multiplying, and then the multiplying unit outputs the arithmetic product back to the input side of the power amplifying unit.

In the implementation of the present invention, the impedance variation of the loudspeaker will not cause the difference of the output power of the power amplifying unit under the same input audio voltage Vin signal level, so the natural uneven frequency/impedance characteristics of the loudspeaker can be improved, and the output distortion can be reduced to obtain the better original sound quality, and the input audio voltage signal level of the present invention is locked by the feedback circuit to obtain the output power, so as to ensure that the power amplifying unit will not be damaged due to the variation of the loudspeaker impedance, which can provide a better service life.

BRIEF DESCRIPTION OF THE DRAWINGS

FIG. 2 is a schematic diagram of the circuit structure of the first embodiment of the audio power amplifier of the present invention.

FIG. 4 grain of the output voltage versus the loudspeaker impedance of the first embodiment of the audio power amplifier of the present invention.

FIG. 6 is a circuit schematic diagram of the third embodiment of the audio power amplifier of the present invention.

DETAILED DESCRIPTION OF THE INVENTION

Figure 1:
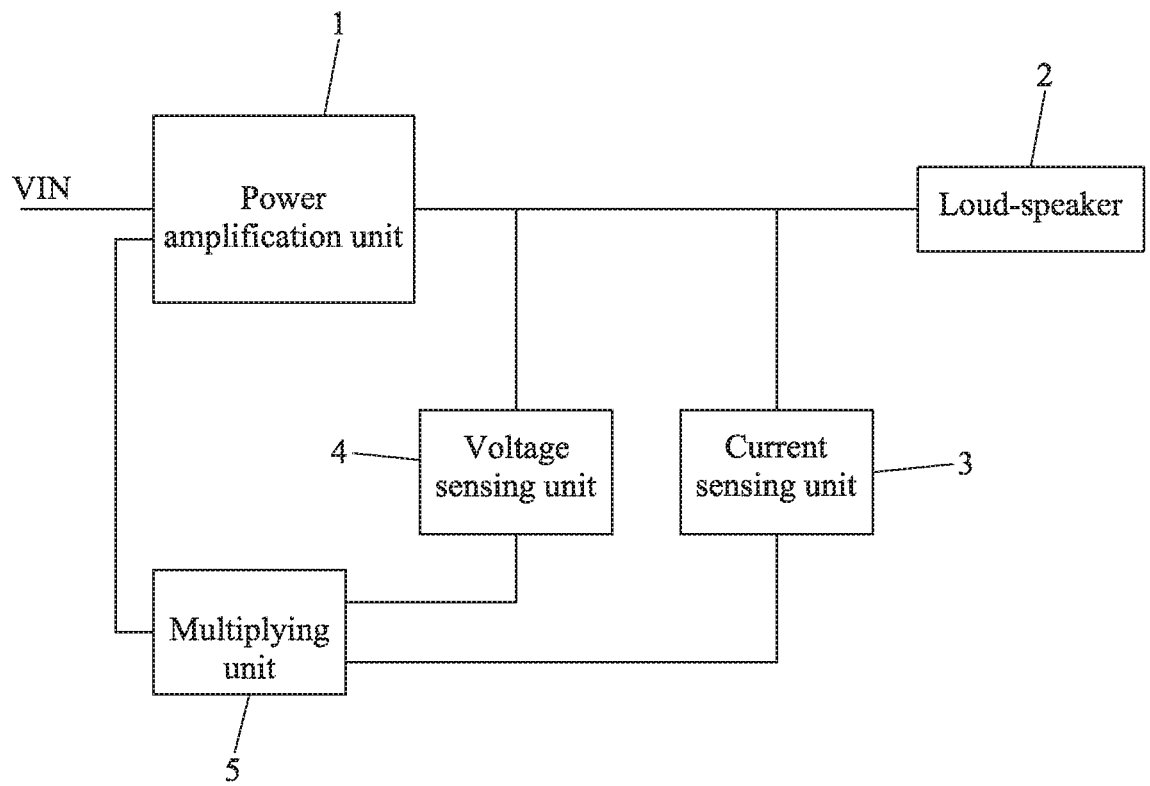
FIG. 1 is a block schematic diagram of the audio power amplifier of the present invention.

Shown as in FIG. 1, the present invention includes a power amplifying unit 1, a loudspeaker 2, a current sensing unit 3, a voltage sensing unit 4 and a multiplying unit 5; the power amplifying unit 1 can be a class A, class AB, Class D and Class G amplifier, it can be single-ended amplifying or bridging (BTL) structure, with input side and output side, the positive input end of the input side inputs the audio voltage Vin signal.

Loudspeaker 2 is electrically connected to the output side of the power amplifying unit 1.

Current sensing unit 3 is electrically connected to the output side of the power amplifying unit 1, and senses the output current of the power amplifying unit 1 and then it is converted into a current control voltage signal The voltage sensing unit 4 is electrically connected to the output side of the power amplifying unit 1, and senses the output voltage of the power amplifying unit 1 to form an output sensing voltage signal.

The input side of the multiplying unit 5 is electrically connected to the current control voltage signal of the current sensing unit 3 and the output sensing voltage signal of the voltage sensing unit 4, and obtains the voltage of the current control voltage multiplied by the output sensing voltage, and the output side of the multiplying unit 5 is electrically connected to the negative input end of the input side of the power amplifying unit 1 and forms a closed loop power feedback structure.

FIG. 2 is a schematic diagram of a circuit structure of a first embodiment of the present invention. The power amplifying unit 1 includes an amplifier A1, and the positive input end of the amplifier A1 inputs an audio voltage Vin signal, and the output is connected to a loudspeaker 2, the loudspeaker 2 has an impedance ZL, and the current sensing unit 3 has a current sensing resistor R5 and a gain device 31 which are much smaller than the impedance ZL of the loudspeaker 2, and outputted to the multiplying unit 5; and the voltage sensing unit 4 has a voltage divider resistor R3, R4 is electrically connected to the output side of amplifier A1, and generates an output sensing voltage inputted to the multiplying unit 5, and the multiplying unit 5 is outputted to the negative input end of the amplifier A1.

The input audio voltage Vin signal of the present invention is amplified by AV times through the amplifier A1, then the loudspeaker 2 has the output power PO of $(Vin*AV)^2/ZL$, and the output power PO can be the linear function relationship PO=F(Vin) of the input voltage Vin under a fixed load condition, so the level of the input voltage Vin can show the output power PO.

The amplifier A1 has a high closed loop gain, generally greater than 80 dB, so a negative feedback must be added to stabilize the gain and increase the bandwidth. When the level of Vin changes, the change amount is amplified by the amplifier A1, so as to show the amplified voltage of the loudspeaker 2 and generate a current IO of the output voltage VO/ZL, and so that the output power PO of the loudspeaker 2 is $VO*IO=VO^2/ZL$.

The voltage divider resistor R3 and R4 of the voltage sensing unit 4 is connected to the power amplifying unit 1 to output the voltage VO, and so the resistor R4 generates an output sensing voltage M1, if A=R4/(R3+R4), the M1=A*VO, and the M1 is inputted to the input side of the multiplying unit 5; and the resistor R5 of the current sensing unit 3 is connected to the loudspeaker 2 to obtain a voltage signal for showing the output current IO, and the voltage signal is amplified by G times through the gain device 31 to generate the current control voltage signal M2.

If B=R5*G; M2=B*IO=B*VO/ZL, the current control voltage signal M2 is inputted to the input side of the multiplying unit 5, and the output of the multiplying unit 5 is MO=M1*M2. MO is an arithmetic product of the output sensing voltage M1 formed by the output voltage VO and the current control voltage M2 formed by the reaction output current IO, and the power level is obtained and fed back to the negative input terminal of the amplifier A1 to form a closed loop control power amplifying system.

Figure 3:
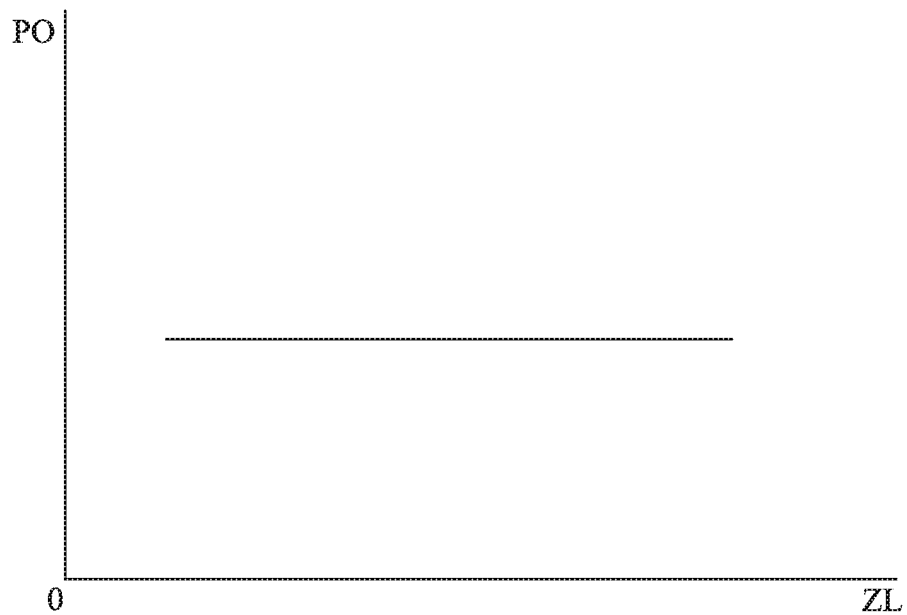
FIG. 3 is a schematic diagram of the output power versus the loudspeaker impedance of the first embodiment of the audio power amplifier of the present invention.

Please refer to FIG. 2~FIG. 4. Since the amplifier A1 of the closed loop power amplification system is positive, the voltage of the negative input terminal is the same as Vin=MO; the MO=(A*VO)*(B*VO/ZL)=A*B(VO$^2$/ZL); if A*B=S; the MO=S*(VO$^2$/ZL)=Vin, so when the same audio voltage Vin signal is inputted but the impedance ZL of the loudspeaker 2 changes, the output voltage VO must correspond to the change, so that MO=S*(VO1$^2$/ZL1)=S*(VO2/ZL2)=S*(VO3$^2$/ZL3), the closed loop has a constant output power PO=K*Vin, and the output power PO and the loudspeaker 2 impedance ZL are in the working range of the amplification system. The conversion characteristics of the amplification system will be in accordance with the functional relation of the output power PO=F(Vin), so that the output power PO=VO1$^2$/ZL1=VO2$^2$/ZL2=VO3$^2$/ZL3 . . . VON$^2$/ZLN, it can no longer be related with the loudspeaker 2 impedance ZL, so there is no distortion of the output power change.

Figure 5:
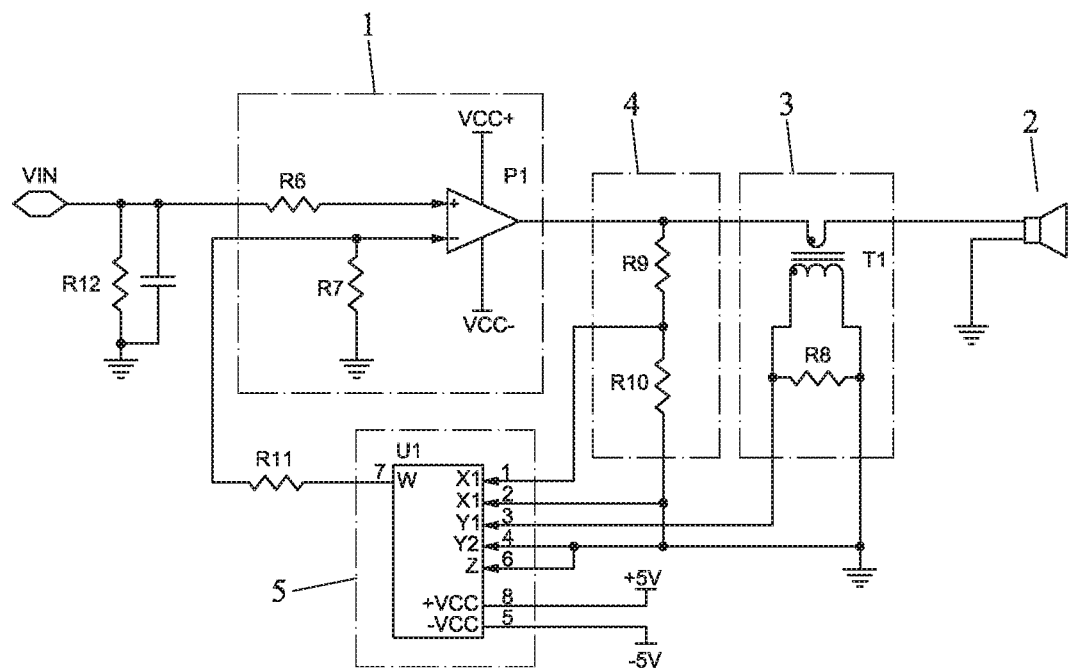
FIG. 5 is a circuit schematic diagram of the second embodiment of the audio power amplifier of the present invention.
Figure 7:
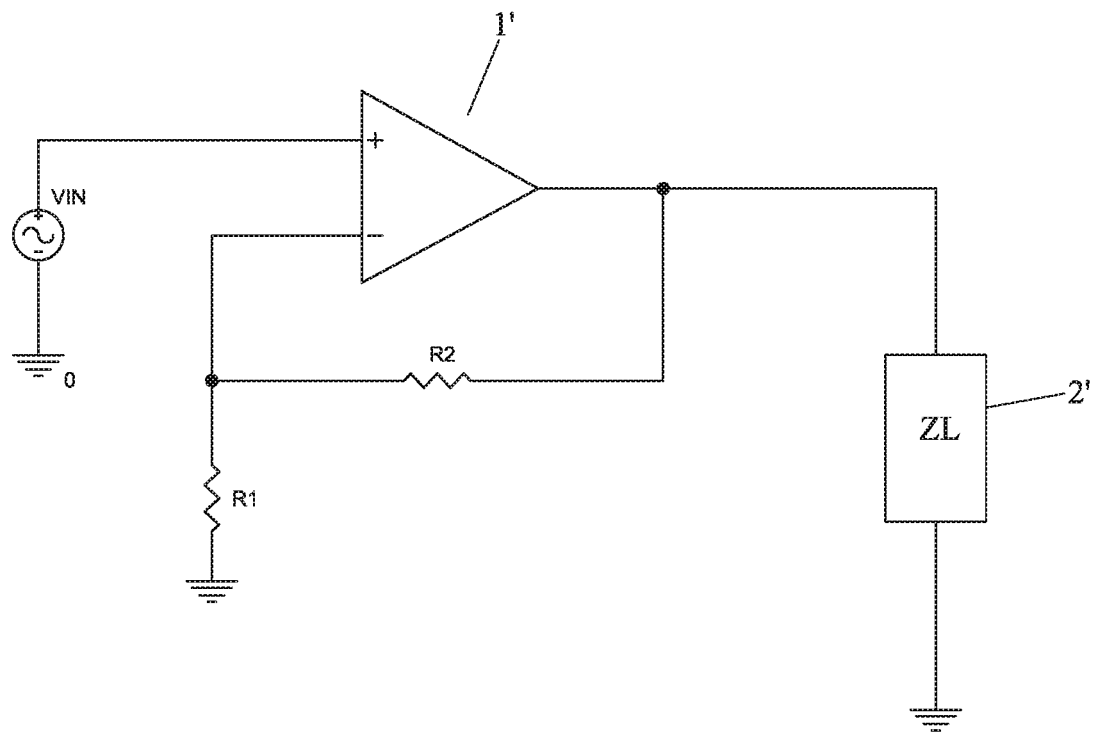
FIG. 7 is a schematic diagram of the conventional audio power amplifier structure.
Figure 8:
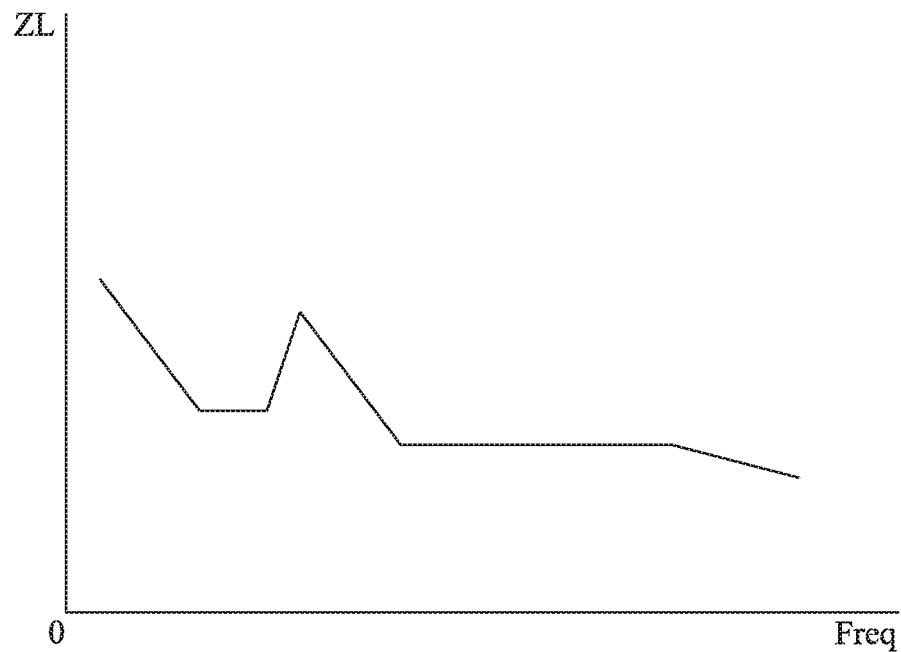
FIG. 8 is a characteristic schematic diagram of the loudspeaker frequency versus the impedance of the conventional audio power amplifier structure.
Figure 9:
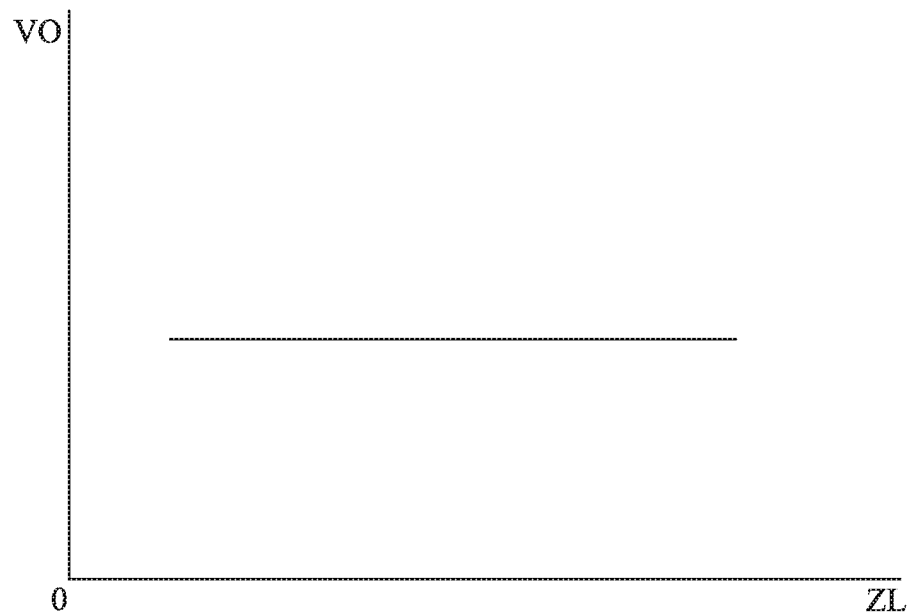
FIG. 9 is a schematic diagram of the output voltage versus the loudspeaker impedance of the conventional audio power amplifier structure.
Figure 10:
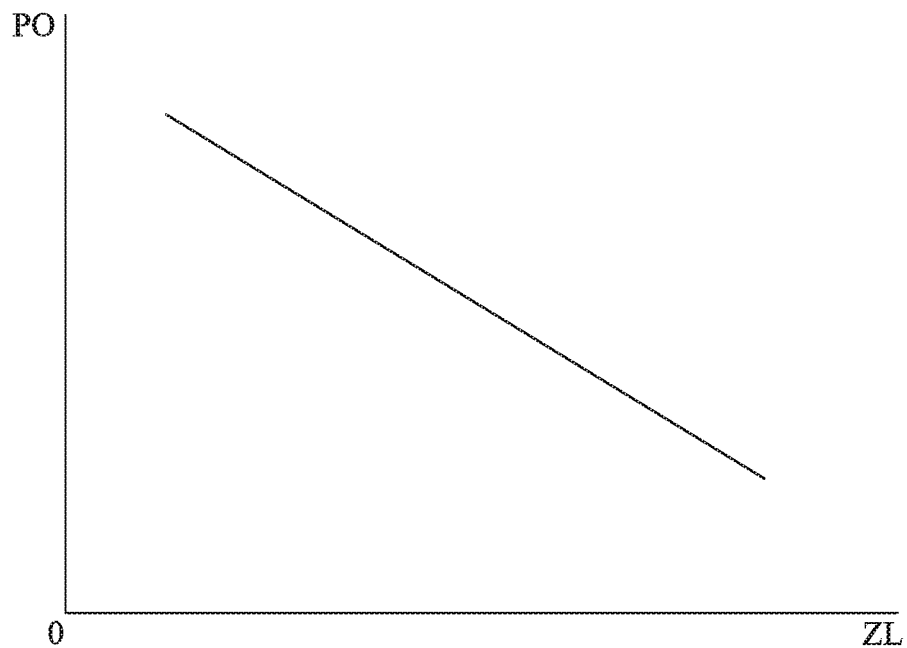
FIG. 10 is a schematic diagram of the output power versus the loudspeaker impedance of the conventional audio power amplifier circuit structure.

Please refer to a second embodiment of the present invention in FIG. 5, the second embodiment mainly includes a power amplifying unit 1, a loudspeaker 2, a current sensing unit 3, a voltage sensing unit 4 and a multiplying unit 5. The power amplifying unit 1 is mainly composed of the resistor R6, resistor R7 and an amplifier P1, and a positive input end is connected to an audio voltage Vin signal and has a power amplification ratio; the current sensing electrical unit 3 mainly includes a current sensing transformer T1 and a resistor R8 connected to the output side of the amplifier P1 of the power amplifying unit 1, and senses the output current of the amplifier P1 and obtains the current control voltage signal inputted to the multiplying unit 5; the voltage sensing unit 4 is connected to the output side of the power amplifying unit 1 and has a voltage divider resistor R9 and resistor R10 to obtain an output sensing voltage signal inputted to the multiplying unit 5; the multiplying unit 5 has a multiplier U1, and the multiplier U1 outputs a feedback to the negative input terminal of the input side of the amplifier P1, and multiplies the current control voltage signal and the output sensing voltage signal by the multiplier U1 to obtain a reaction output power information fed back to the amplifier P1, and the amplifier P1 can show the loudspeaker 2 impedance variation to maintain a constant output power.

Please refer to a third embodiment of the present invention in FIG. 6. The third embodiment is similar to the second embodiment in that it includes a power amplifying unit 1, a loudspeaker 2, a current sensing unit 3, and a voltage sensing unit 4, a multiplying unit 5 and a BTL bridging structure capable of adding twice the input voltage. The power amplifying unit 1 is mainly composed of a resistor R13, a resistor R14 and an amplifier P2 to form a non-inverting amplifier, and a resistor R15, a resistor R16 and an amplifier P3 to form an inverting amplifier, wherein the positive input end and negative input end of the amplifier P2 and amplifier P3 respectively input audio voltage Vin+ signal and Vin− signal; the amplifier P2 and amplifier P3 are outputted to the loudspeaker 2. The current sensing unit 3 mainly includes two current sensing transformers T2 and T3 as well as the resistor R17 electrically connected respectively to the output sides of the amplifier P2 and amplifier P3, which respectively sense the output current of the amplifier P2 and amplifier P3 to obtain the current control voltage signal inputted to the multiplying unit 5. The voltage sensing unit 4 includes a voltage divider resistor R18 and a resistor R19 connected to the output side of the amplifier P2 and the voltage divider resistor R20 and resistor R21 connected to the output side of the amplifier P3, respectively to obtain the sensing voltage outputted by the amplifier P2 and amplifier P3; and an adder circuit is composed of an amplifier P4, resistor R22, resistor R23, resistor R24 and resistor R25, wherein the input side inputs the two sensing voltages respectively, and outputs an output sensing voltage with a sum of two sensing voltages. The multiplying unit 5 includes a multiplier U2, and inputs the aforementioned current control voltage and outputs the sensing voltage multiplied to form a reaction output power voltage which is then fed back to the input side of the amplifier P2 and amplifier P3, which can show the loudspeaker 2 impedance change to maintain the output constant power effect.

Although the invention has been explained in relation to its preferred embodiments, it is to be understood that many other possible modifications and variations can be made without departing from the spirit and scope of the invention as hereinafter claimed.

The invention claimed is:

1. An audio amplifier structure with power feedback comprising:
    a power amplifying unit with an input side having a positive input end and a negative input end, and an output side, wherein an audio voltage signal is input to the positive input end of the input side;
    a loudspeaker electrically connected to an output side of the power amplifying unit;
    a current sensing unit electrically connected to the output side of the power amplifying unit and sensing an output current of the power amplifying unit output to a loudspeaker, and converting the output current into a current control voltage signal;
    a voltage sensing unit electrically connected to the output side of the power amplifying unit, and sensing the output voltage of the power amplifying unit to form an output sensing voltage signal;
    an analog multiplying unit having an input side and an output side, the input side electrically connected to both an output of the current sensing unit to receive the current control voltage signal and to an output of the voltage sensing unit to receive the output sensing voltage signal, and obtains an arithmetic product of the voltage of the current control voltage multiplied by the output sensing voltage, and the output side of the analog multiplying unit electrically connected to the negative input end of the input side of the power amplifying unit to form a closed loop power feedback structure.

2. The audio amplifier structure with power feedback defined in claim 1, wherein the power amplifying unit can be a single-ended amplification or bridging (BTL) structure.

3. The audio amplifier structure with power feedback defined in claim 1, wherein the voltage sensing unit has a voltage divider resistor that generates an output sense voltage.

4. The audio amplifier structure with power feedback defined in claim 1, wherein the current sensing unit includes a current sensing resistor.

5. The audio amplifier structure with power feedback defined in claim 1, wherein the current sensing unit includes at least one current sensing transformer.

6. A method of improving sounds quality of an audio amplifier with power feedback, comprises the steps of:
    setting a power amplifying unit, the power amplifying unit having an input side and an output side, wherein the output side is connected to a loudspeaker;
    determining an output current signal output from the power amplifying unit to the loudspeaker;
    determining an output voltage signal output from the power amplifying unit;
    multiplying the output current signal by the output voltage signal using an analog multiplying unit to obtain an output power level signal; and
    feeding back the output power level to the input side of the power amplifying unit to form a feedback closed loop structure.

7. The method of the audio amplifier with power feedback defined in claim 6, wherein the output current signal is converted into a current control voltage signal; the output voltage of the power amplifying unit is converted into an output sensing voltage signal by voltage division; wherein the current control voltage signal and the output sensing voltage signal are inputted to the analog multiplying unit for multiplying, the multiplying unit outputs the arithmetic product to the input side of the power amplifying unit.

8. The method of the audio amplifier with power feedback defined in claim 6, wherein a current sensing unit is electrically connected to the power amplifying unit and the method further comprises selecting the current signal outputted from the power amplifying unit.

9. The method of the audio amplifier with power feedback defined in claim 8, wherein the current sensing unit includes a current sensing resistor.

10. The method of the audio amplifier with power feedback defined in claim 8, wherein the current sensing unit includes at least one current sensing transformer.

* * * * *